(12) United States Patent
Manning

(10) Patent No.: US 6,469,542 B2
(45) Date of Patent: Oct. 22, 2002

(54) VOLTAGE LEVEL TRANSLATOR

(75) Inventor: Troy Manning, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/991,504

(22) Filed: Nov. 16, 2001

(65) Prior Publication Data

US 2002/0030508 A1 Mar. 14, 2002

Related U.S. Application Data

(63) Continuation of application No. 09/691,415, filed on Oct. 17, 2000, which is a continuation of application No. 09/327,040, filed on Jun. 7, 1999, now Pat. No. 6,137,312, which is a continuation of application No. 08/803,343, filed on Feb. 20, 1997, now Pat. No. 5,910,734.

(51) Int. Cl.[7] .................. H03K 19/094; H03K 19/01
(52) U.S. Cl. .............. 326/81; 326/68; 326/17
(58) Field of Search ................ 326/68, 80–81, 326/17, 62, 83, 86–87

(56) References Cited

U.S. PATENT DOCUMENTS

| 4,318,015 A | 3/1982 | Schade, Jr. | |
| 4,498,021 A | 2/1985 | Uya | |
| 4,978,870 A | 12/1990 | Chen et al. | |
| 5,065,361 A | 11/1991 | Yoshizawa et al. | 365/104 |
| 5,136,190 A | 8/1992 | Chern et al. | |
| 5,455,521 A | 10/1995 | Dobbelaere | 376/17 |
| 5,528,173 A | 6/1996 | Merritt et al. | 326/80 |
| 5,614,859 A | 3/1997 | Ong | 327/333 |
| 5,659,258 A * | 8/1997 | Tanabe et al. | 326/68 |
| 5,739,700 A | 4/1998 | Martin | 326/80 |
| 5,910,734 A | 6/1999 | Manning | 326/81 |
| 6,137,312 A | 10/2000 | Manning | 326/81 |

FOREIGN PATENT DOCUMENTS

JP  402268516 A  * 11/1990  .................. 326/80

* cited by examiner

*Primary Examiner*—Michael Tokar
*Assistant Examiner*—James H Cho
(74) *Attorney, Agent, or Firm*—Russell D. Slifer; Fogg Slifer Polglaze Leffert & Jay PA

(57) ABSTRACT

A translator includes an initial circuit device configured to charge a translator output to a first voltage level in response to a change in an input signal. The translator further includes a sensing device configured to detect the output's potential approaching the first voltage level and smoothly shift charging functions over to a secondary circuit device, which will continue to charge the output up to a second voltage level.

3 Claims, 3 Drawing Sheets

VOLTAGE LEVEL TRANSLATOR

RELATED APPLICATIONS

This application is a continuation of U.S. Application Ser. No. 09/691,415, filed Oct. 17, 2000; which is a continuation of U.S. application Ser. No. 09/327,040, filed Jun. 7, 1999 and issued as U.S. Pat. No. 6,137,312; which is a continuation of U.S. application Ser. No. 08/803,343 filed Feb. 20, 1997 and issued as U.S. Pat. No. 5,910,734.

TECHNICAL FIELD

This invention relates generally to electronic devices and, more specifically, to a voltage level translator circuit used in an electronic device.

BACKGROUND OF THE INVENTION

There are many instances involving integrated devices where voltage level translator circuits are needed to interface between operations circuits that function at different voltage levels. One operations circuit, for example, may transmit high signals based on a source voltage $V_{CC}$. However, a second operations circuit receiving signals from the first might only recognize high signals at a greater voltage $V_{CC}'$. Therefore, a translator circuit is electrically interposed between the two operations circuits to receive a signal from the first and, if it is a high signal, to output a signal with an even higher voltage $V_{CCP}$ that will properly register as a high signal in the second circuit.

One example of a translator in the prior art achieves this result in two distinct charging steps interrupted by a delay. As an input signal changes from low to high, this first prior art translator will begin to charge its output signal to $V_{CC}$. A portion of the translator's circuitry, however, does not immediately register the change in the input signal due to a delaying element incorporated into the translator. Once the intermediate step of charging the output to $V_{CC}$ is complete, the delaying element finally transmits the changed input to the remaining circuitry, which then completes the translation process by charging the output from $V_{CC}$ to $V_{CCP}$.

Such a translator, however, requires several transistors as well as logic devices, resulting in a relatively large circuit, which runs contrary to the desired goal of saving die space. Further, it should be noted that the proper delaying element must be chosen in advance of using the translator in non-test operations. If the delay is not long enough to allow the output signal to initially charge to $V_{CC}$, a new delaying device must be chosen to accommodate the translator circuit. Conversely, too long of a delay runs contrary to the desired goal of quick circuit operations. Therefore, it would be desirable to have a translator that is not only smaller but is also capable of translating an input signal at a faster rate without having to pick-and-choose the proper delaying element.

A second translator in the prior art attempts to do just that by directly driving its output to $V_{CCP}$, with no transition stage at $V_{CC}$. While this second prior art translator is smaller and faster than the first, one of ordinary skill in the art can appreciate that the direct translation to $V_{CCP}$ requires a larger charge pump than one used in the two stage translator. As a result, the larger charge pump uses more of the available operating current. Given the inefficiency in terms of a charge pump's ability to use operating current, a direct translation to $V_{CCP}$ is not be desirable in certain applications. Therefore, it would be a major advance in the art to have a translator that is smaller and faster than the first prior art example, yet would allow charging to an intermediate voltage and then to $V_{CCP}$ in order to avoid the inefficiency of the large charge pump used in the second prior art example.

SUMMARY OF THE INVENTION

Accordingly, the present invention concerns a translator that provides an output signal having a generally consistent transition from an initial voltage to a secondary voltage and, eventually, to a final voltage, in response to a changing input signal. In one preferred embodiment, the translator is configured to sense when its output load is approaching a charge of magnitude $V_{CC}$. This embodiment is further configured to automatically begin charging the output load to $V_{CCP}$ at or around that time without the use of a delaying element. One advantage of this embodiment is that it is smaller and faster than prior art translators that operate using a discrete two-stage process to output a $V_{CCP}$ signal. A further advantage of this embodiment is that it uses less current than prior art translators that directly charge an output load to $V_{CCP}$.

DETAILED DESCRIPTION OF THE PREFERRED EMBODIMENT

Figure 1:
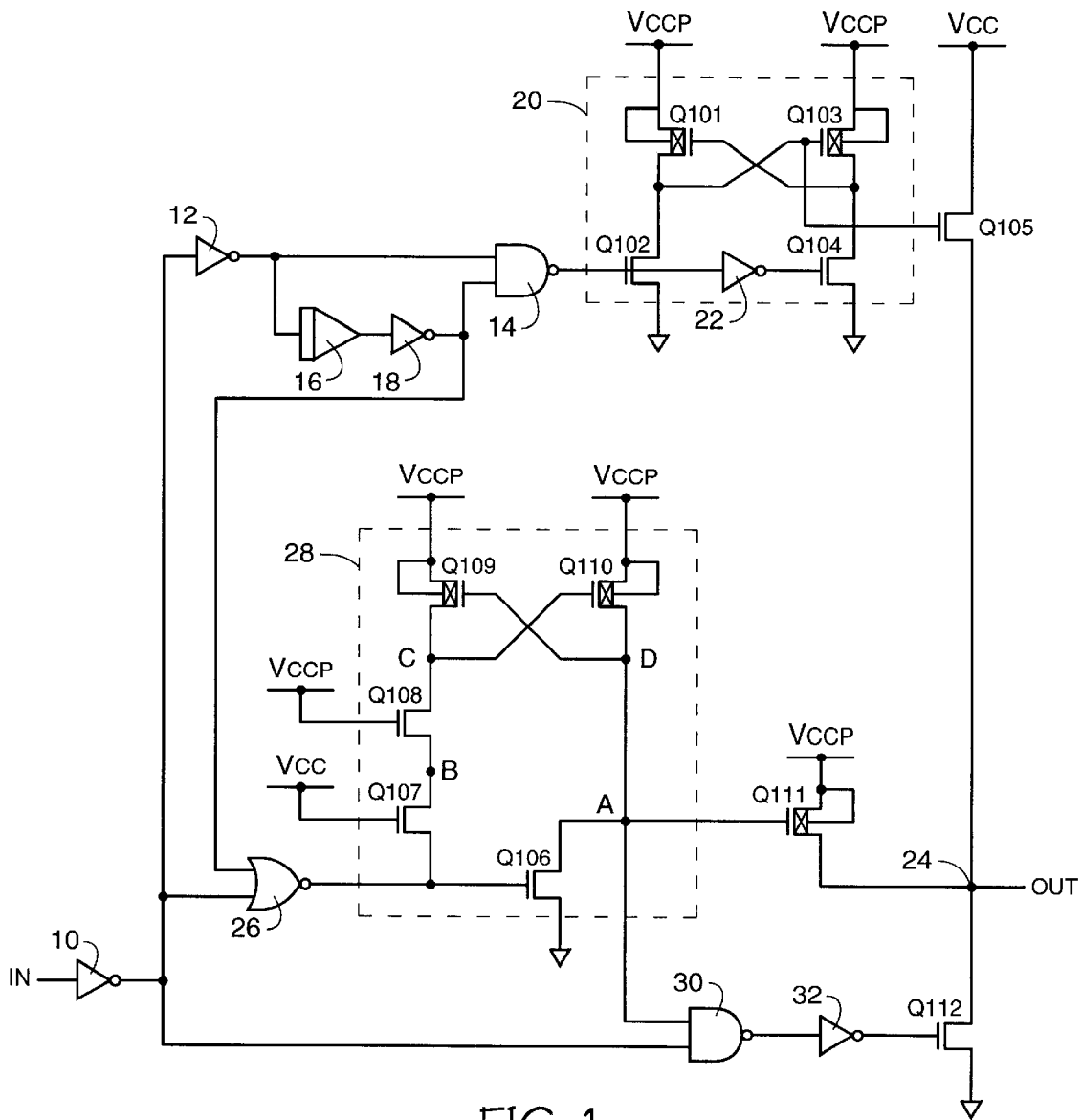
FIG. 1 depicts an example of a translator as used in the prior art.

FIG. 1 illustrates the two-stage translator found in the prior art. An input signal IN enters a first inverter 10 and the output is connected to three separate paths. First, the inverted signal passes through a second inverter 12. The output of this second inverter 12 is coupled to the first input of a first NAND gate 14. The output of the second inverter 12 also couples to a delaying element 16, which outputs to a third inverter 18. The third inverter 18, in turn, has an output coupled to a second input of the first NAND gate 14. The output of the first NAND gate 14 serves as the input for a first circuit portion 20. The first circuit portion 20 is comprised of a p-channel transistor Q101 with a source coupled to $V_{CCP}$ and a drain coupled to the drain of an n-channel transistor Q102. The source of transistor Q102, in turn, couples to ground. The two coupled drains serve as an output for the first circuit portion 20 and are also connected to the gate of another p-channel transistor Q103, which also has a source connected to $V_{CCP}$. Further, the transistor Q103 has a drain attached to the drain of another n-channel transistor Q104 having a grounded source. The coupled drains of Q103 and Q104 attach to the gate of Q101. The output of the first NAND gate 14 drives the gate of transistor Q102. The first circuit portion 20 is further comprised of a fourth inverter 22, which also receives the output of the first NAND gate 14 and inverts that signal before it reaches the gate of transistor Q104. The output of the first circuit portion 20 drives the gate of an n-channel transistor Q105, which has a drain coupled to $V_{CC}$ and a source coupled to the main output node 24.

The output of first inverter 10 also couples to a first input of a NOR gate 26. The NOR gate 26 receives a second input from the third inverter 18. The output of the NOR gate 26 enters a second circuit portion 28. This second circuit portion is comprised of an n-channel transistor Q106 that is driven by the output of NOR gate 26. Transistor Q106 also has a source coupled to ground and a drain coupled to a node A. The output of NOR gate 26 also couples to the source of an n-channel transistor Q107, which is driven by $V_{CC}$ and has a drain coupled to the source of another n-channel transistor Q108 at node B. Transistor Q108 is driven by $V_{CCP}$ and has a drain that couples at node C to the drain of a p-channel transistor Q109. The source of transistor Q109 is attached to $V_{CCP}$. The coupled drains of Q109 and Q108 are connected to the gate of another p-channel transistor Q110, which also has a source attached to $V_{CCP}$. By way of node D, the drain of transistor Q110 is coupled to the gate of transistor Q109, as well as to node A. Node A represents the output of the second circuit portion 28, and connects to the gate of a p-channel transistor Q111. The source of transistor Q111 connects to $V_{CCP}$ and the drain of Q111 connects to the main output node 24. Node A also connects to a first input of a second NAND gate 30.

Figure 2:
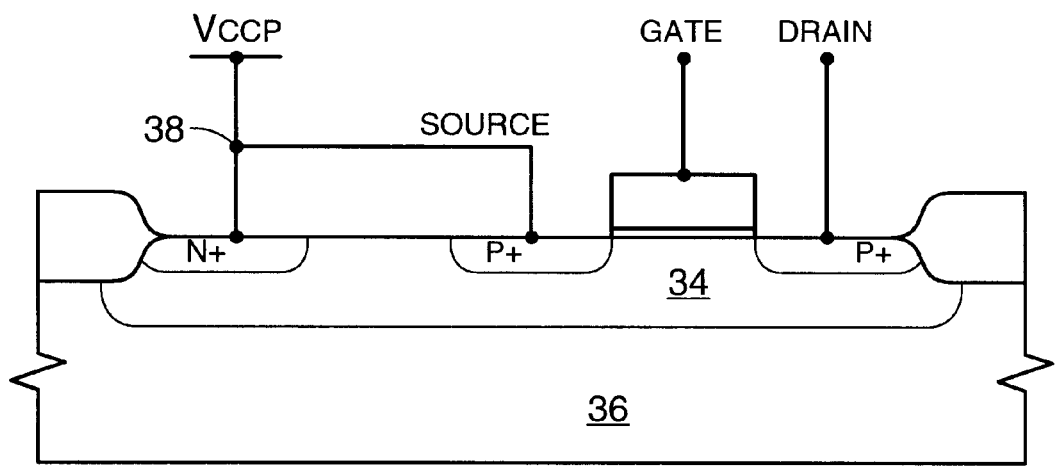
FIG. 2 is a cross-sectional view of a p-channel transistor which may be used in prior art as well as in an exemplary embodiment of the present invention.

Finally, the output of first inverter 10 acts as a second input for the second NAND gate 30. The output of this second NAND gate 30 passes through a fifth inverter 32 and drives an n-channel transistor Q112. Transistor Q112 has a source coupled to ground and a drain coupled to the main output node 24. Output node 24 is also coupled to a path configured to carry an output signal OUT. A final matter of coupling this prior art translator is illustrated in FIG. 2. For every p-channel transistor, an n-well 34 within a p-region 36 is coupled to $V_{CCP}$ at node 38 to provide the proper back bias.

The discrete two-step operation of this translator is best illustrated by examining its functions as IN changes from a low to high signal. The initial low signal from IN results in a high signal output from the first inverter 10. This high signal is again changed at the second inverter 12 to a low signal, which is input to the first NAND gate 14 and the delaying element 16. At this point, the signal IN has remained low long enough for the delay element 16 to transmit the low signal to the third inverter 18, which outputs a high signal. This high signal combines with the low signal from the second inverter 12 in the NAND gate 14. The resulting high signal enters the first circuit portion 20 and turns on transistor Q102. Further, the high signal is inverted by the fourth inverter 22, and the low signal output turns off transistor Q104. With transistor Q102 on, the gate of transistor Q103 is grounded, thereby turning on Q103. Because Q104's off state prevents Q103's signal from grounding, Q103 instead transmits a high signal to Q101's gate, turning Q101 off. In addition, Q101's off state and Q102's on state result in a low signal output from the first circuit portion 20. This low signal turns off transistor Q105, isolating $V_{CC}$ from the main output node 24.

Meanwhile, the high signal from the third inverter 18 combines with the high signal from the first inverter 10 at the NOR gate 26, which outputs a low signal to the second circuit portion 28. This low signal turns off transistor Q106. In doing so, node A is isolated from ground. Moreover, the low signal induces a corresponding low voltage at node C, which consequently turns on transistor Q110. As a result, transistor Q110 transmits a high signal to transistor Q109, turning Q109 off. This high signal also reaches node A and is output from the second circuit portion 28. The high signal turns off transistor Q111, isolating $V_{CCP}$ from the main output node 24.

The high signal from node A combines with the high signal from the first inverter 10 at the second NAND gate 30. The low signal from the NAND gate 30 is changed by the fifth inverter 32, and the high signal from the fifth inverter 32 turns on Q112, grounding any signals that reach the main output node 24. Thus, the low signal IN causes a low signal OUT.

As the IN signal changes from a low to a high signal, the first inverter 10 outputs a low signal and, hence, the second inverter 12 outputs a high signal. The first NAND gate 14 receives this high signal as a first input. However, the new high signal is held up by the delaying element 16 and, as a result, the third inverter 18 temporarily continues to output a high signal to the second input of the first NAND gate 14. Receiving two high signals, the first NAND gate 14 transmits a low signal to the first circuit portion 20. This low signal turns off transistor Q102. Further, the low signal passes through the fourth inverter 22 and the resulting high signal turns on transistor Q104, which provides a path to ground. This grounding turns on transistor Q101, which provides a path from $V_{CCP}$. With transistor Q102 off, the $V_{CCP}$ signal from Q101 has no path to ground and is therefore diverted to the gate of transistor Q103, turning off Q103. The $V_{CCP}$ signal is also transmitted to the gate of Q105, thereby turning on Q105. With transistor Q105 on, the $V_{CC}$ signal coupled to the drain of transistor Q105 is able to reach the main output node 24. It should be noted that this configuration allows a full $V_{CC}$ signal to be transmitted. If transistor Q105 were driven by a mere $V_{CC}$ signal, only a signal of magnitude $V_{CC}-V_t$ could pass through transistor Q105, where $V_t$ is the voltage threshold of transistor Q105.

Because of the high signal that is temporarily transmitted from the third inverter 18, the NOR gate 26, receiving this high signal as well as the low signal from the first inverter 10, continues to send out a low signal to the second circuit portion 28. As a result, the state of the second circuit portion 28 does not change: a high signal at node A (1) turns off transistor Q111, thereby isolating $V_{CCP}$ from the main output node; and (2) acts as one input for the second NAND gate 30. The other input for the second NAND gate 30 is the low signal from the first inverter 10. The resulting high signal is inverted by the fifth inverter 32 so that the final low signal turns off transistor Q112, preventing any output signals from grounding at that point. Therefore, during this transition phase, while the delaying element 16 is postponing the change of signals, the translator's output signal OUT increases to $V_{CC}$.

After a time determined by the configuration of the delay element 16, the high signal output from the second inverter 12 reaches the third inverter 18, thereby triggering the second stage of translation. The first NAND gate 14 accepts the low signal from the third inverter 18 and the high signal from the second inverter 12. The resulting high signal from the first NAND gate 14 returns the first circuit portion 20 to the state originally described, with transistors Q102 and Q103 on, transistors Q101 and Q104 off, and a low signal output from the first circuit portion 20 that turns off transistor Q105. With transistor Q105 off, $V_{CC}$ can no longer reach the main output node 24.

At the same time, however, the newly generated low signal from the third inverter 18, in combination with the low signal from the first inverter 10, results in a high signal output from the NOR gate 26. This allows transistor Q107 to push node B to $V_{CC}-V_t$. Node C is also pushed to this level, which partially turns off transistor Q110. Because a full $V_{CC}$ signal is not applied to transistor Q110, Q110 continues to pass some current. However, the high signal from the NOR gate 26 also turns on transistor Q106, which is configured to be large enough to overdrive Q110. With transistor Q106 on, a path to ground is provided for nodes A and D. Node D's connection to ground turns on Q109, which in turn allows a $V_{CCP}$ signal to reach the gate of transistor Q110 through node C, turning off transistor Q110 completely. Node A's connection to ground turns on Q111, allowing a $V_{CCP}$ signal to reach the main output node 24.

Grounded node A further provides a low signal for the second NAND gate 30, which also accepts the low signal from the first inverter 10. The high signal output from the second NAND gate 30 is inverted by the fifth inverter 32 so that a low signal maintains transistor Q112's off-state. Thus, the $V_{CCP}$ signal originating at transistor Q111 is transmitted as the translator's output signal OUT. In this way, a high input signal is translated into a signal of magnitude $V_{CCP}$.

In translating an IN signal changing from high to low, the translator circuit is initially at the state described immediately above: the $V_{CC}$ signal is isolated because transistor Q105 is off; a direct path to ground is not available because transistor Q112 is off; and with transistor Q111 on, $V_{CCP}$ is output as the translator's OUT signal. As IN transmits a low signal, the first inverter 10 sends a high signal to the second inverter 12. The second inverter 12 transmits a low signal to the first NAND gate 14. However, because the low signal from the second inverter 12 has not yet cleared the delaying element 16, the third inverter 18 still outputs a low signal for the first NAND gate 14. Given these two low signals, the first NAND gate 14 continues to send a high signal to the first circuit portion 20. It follows that the first circuit portion 20 continues to send a low signal to Q105 and isolate $V_{CC}$ from the main output node 24.

Nevertheless, the high signal from the first inverter 10 does change the output from the NOR gate 26. The high signal from the first inverter 10 plus the remaining low output from the third inverter 18 causes the NOR gate 26 to send a low signal to the second circuit portion 28. This turns off transistor Q106, isolating the drain of Q110 and the gate of Q109 from ground. Further, a low signal is then transmitted through node C to transistor Q110, turning on that transistor. A $V_{CCP}$ signal then passes through transistor Q111 and node D to transistor Q109, turning it off. Further, this $V_{CCP}$ signal transmits to node A, turning off transistor Q111 and isolating $V_{CCP}$ from the main output node 24.

The high signal from node A also enters the second NAND gate 30, which also receives the high signal from the second inverter 12. The result from the second NAND gate 30 is a low signal, which is inverted by the fifth inverter 32. The output high signal turns on transistor Q112, which grounds the main output node 24 and, thus, the signal OUT.

Moreover, the transition of OUT to a low signal is not affected by the function of the delaying element 16. Even after the third inverter 18 receives the low signal from the second inverter 12, the resulting high signal does not change the input to the first circuit portion 20. Having received a low signal from the second inverter 12 in addition to the new high signal from the third inverter 18, the first NAND gate 14 continues to send a high signal to the first circuit portion 20. Similarly, the NOR gate continues to send a low signal to the second circuit portion 28. Thus the $V_{CC}$ and $V_{CCP}$ signals continue to be isolated and the signal OUT continues to be pulled to ground through transistor Q112.

Figure 5:
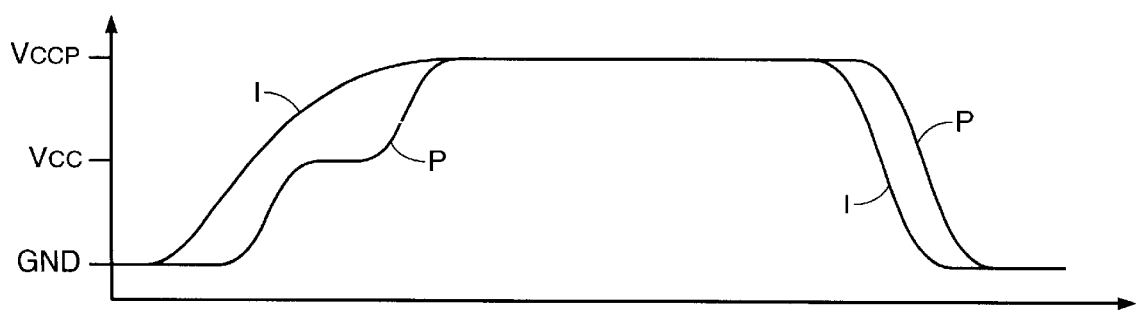
FIG. 5 is a graph illustrating output voltage over time of the prior art translator of FIG. 1 as compared to an exemplary embodiment in accordance with the present invention.

In FIG. 5, line P graphically demonstrates the operation of this prior art translator. The right portion of line P represents the translation of an IN signal going from high to low voltage. The relatively smooth transition indicates that OUT is not affected by the delaying element in a high to low operation.

The left side of the graph, however, clearly illustrates the two stage process required to translate a signal IN going from a low to high voltage. Line P demonstrates one transition from ground to $V_{CC}$. The leveling slope of line P occurs as OUT approaches $V_{CC}$ but the delaying element 16 has not yet allowed $V_{CCP}$ to couple to the main output node 24. Once the delay is over, the signal OUT then once again begins to increase in voltage until $V_{CCP}$ is reached.

Figure 3:
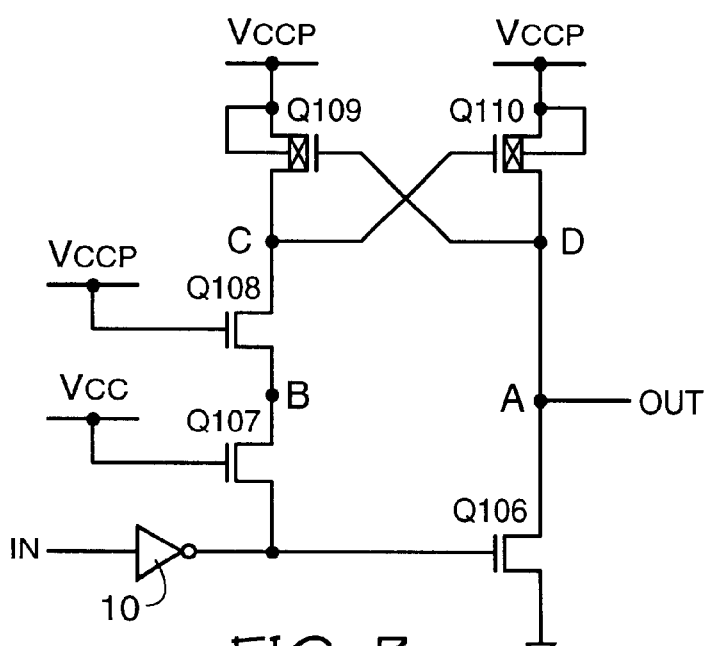
FIG. 3 illustrates a second translator used in the prior art.

FIG. 3 illustrates the smaller, faster circuit that translates a low-to-high signal directly to $V_{CCP}$, without the use of a transitory $V_{CC}$ source. This translator is essentially a paired-down version of the first translator, with only the second circuit portion 28 and the first inverter 10 remaining. As a result, this translator operates in a manner similar to that second circuit portion 28. Given a low signal IN, the first inverter 10 sends out a high signal. This high signal allows transistor Q107 to push node B to $V_{CC}-V_t$. Node C is also pushed to that level, thereby partially turning off transistor Q110. The high signal from the first inverter 10 also turns on transistor Q106. Having been configured to be able to overdrive transistor Q110, transistor Q106 grounds any signal passing through transistor Q110. This creates a low voltage at node D, which turns on transistor Q109. The resulting $V_{CCP}$ signal completely turns off transistor Q110. With node A also coupled to ground via transistor Q106, this translator's output signal OUT is a low signal.

As the signal IN increases to a high signal, the first inverter 10 transmits a low signal that turns off transistor Q106. At this stage, node C carries a low signal to transistor Q110, which turns on accordingly. With no path to ground through transistor Q106, a $V_{CCP}$ signal travels through transistor Q110 and node D to the gate of transistor Q109. This $V_{CCP}$ signal turns off Q109. Further, this $V_{CCP}$ signal travels to node A and ultimately serves as the output signal OUT. Thus, as a high signal is input, the translator drives its load directly to $V_{CCP}$, with no transition stage involving $V_{CC}$. Should signal IN make the transition from a high signal back to a low signal, the translator would return to the state originally described above.

Figure 4:
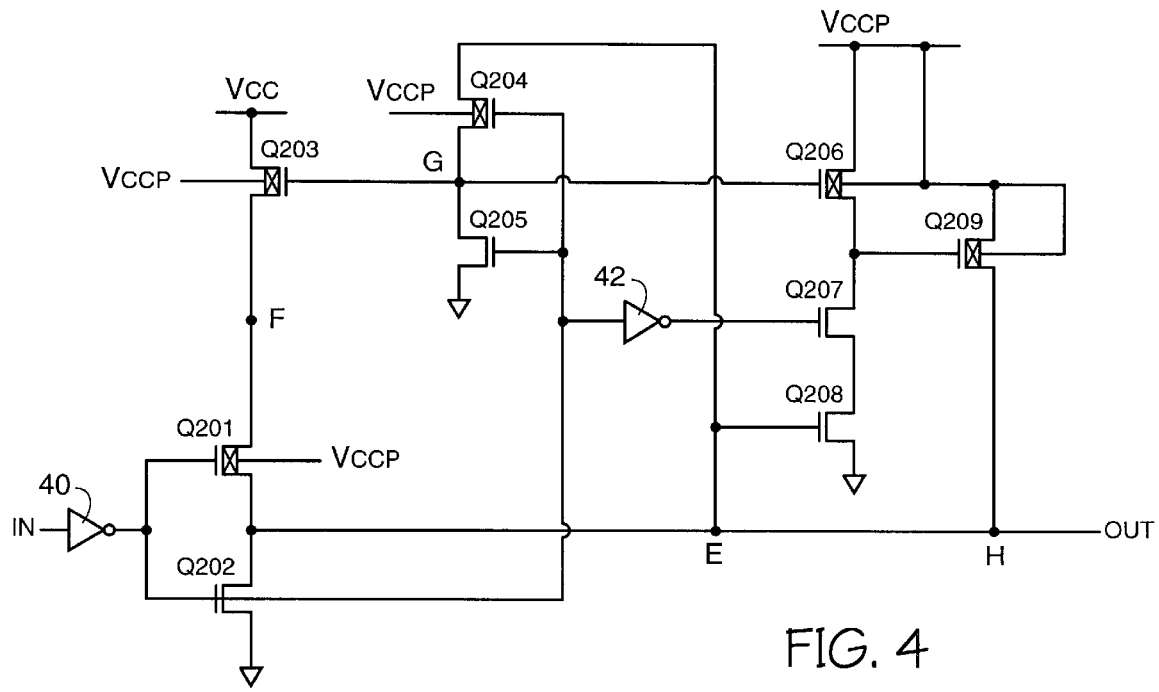
FIG. 4 is a schematic diagram of an exemplary embodiment in accordance with the present invention.

FIG. 4 illustrates a preferred embodiment of the current invention. An input signal IN leads to a primary inverter 40. The output of the primary inverter couples to the gate of a p-channel transistor Q201 and the gate of an n-channel transistor Q202. In addition to having coupled gates, the drains of transistors Q201 and Q202 are coupled to each other. The coupled drains are in turn connected to a node E. The source of transistor Q202 is coupled to ground and the source of transistor Q201 is coupled at a node F to the drain of another p-channel transistor Q203. Transistor Q203 has a source coupled to a source voltage $V_{CC}$. Further, as described earlier and illustrated in FIG. 2, transistor Q203, as well as every other p-channel transistor in this exemplary embodiment, has an n-well 34 within a p-region 36 is coupled to $V_{CCP}$ at node 38 to provide the proper back bias.

It should also be noted that the values of $V_{CC}$ and $V_{CCP}$ in this exemplary embodiment may not necessarily have the same values as discussed in the prior art translators. Further, it should be noted that, while this invention can be coupled to various voltage sources, no voltage source is claimed as part of the invention.

Returning to the primary inverter 40, its output drives the coupled gates of another pair of transistors: p-channel transistor Q204 and n-channel transistor Q205. The drains of transistors Q204 and 205 join at a node G. The source of transistor Q205 is coupled to ground and the source of transistor Q204 is coupled to node E. In addition, node G is coupled to the gate of transistor Q203. The output of primary inverter 40 also serves as input for a secondary inverter 42.

This exemplary embodiment also contains three transistors, Q206, Q207, and Q208, coupled in series. Transistor Q206 is a p-channel transistor with a source coupled to $V_{CCP}$ and a drain coupled to the drain of n-channel transistor Q207. The source of transistor Q207 is coupled to the drain of n-channel transistor Q208, whose source couples to ground. The gate of transistor Q206 is connected to node G; the gate of transistor Q207 is connected to the output of the secondary inverter 42; and the gate of transistor Q208 is connected to node E. Finally, the coupled drains of transistors Q206 and Q207 drive a p-channel transistor Q209. The source of transistor Q209 is coupled to $V_{CCP}$ and the drain of Q209 is coupled to an output node H. Output node H is also connected to node E and carries the translator's output signal OUT.

Once again, the operation of this exemplary circuit is best demonstrated by examining its function as IN changes from a low to a high signal. The initial low signal IN is inverted by the by the primary inverter 40. The resulting high signal turns on transistor Q202 but turns off transistor Q201. Further, with Q202 providing a path to ground for output node H, OUT is a low signal. Additionally, Q202's activation results in a low voltage signal passing through node E to transistor Q208, turning that transistor off as well.

The high signal output from the primary inverter 40 also turns off transistor Q204 even as it turns on transistor Q205. As Q205 provides a path to ground, the resulting low voltage at node G turns on Q203. As a result, node F is pushed to $V_{CC}$. With Q201 in an off state, however, the $V_{CC}$ charge is isolated from the rest of the circuit. The low voltage at node G also turns on transistor Q206.

The high signal from the primary inverter 40 is inverted by the secondary inverter 42, thereby turning off transistor Q207. Thus, with transistor Q206 on and transistors Q207 and Q208 off, a $V_{CCP}$ signal drives transistor Q209, turning off Q209 as well. Therefore, with IN transmitting a low signal, OUT also transmits a low signal, as it is coupled to ground through output node H and transistor Q202. Moreover, $V_{CCP}$ is isolated from the circuit, but a $V_{CC}$ charge is stored within the circuit in anticipation of future changes in the IN signal.

As the signal IN increases to high, the $V_{CC}$ signal from node F reaches output node H. The manner in which this takes place begins as the high IN signal is inverted to a low signal by the primary inverter 40. This low signal turns off transistor Q202 and turns on Q201. Thus, the $V_{CC}$ signal at node F is diverted through nodes E and H as the OUT signal.

However, even as OUT approaches a potential of $V_{CC}$, the translator is operating to isolate the $V_{CC}$ source. The low signal from the primary inverter 40 turns on transistor Q204 and turns off transistor Q205. Thus, the high signal from node E is transmitted by way of the source of transistor Q204 and through node G to the gate of transistor Q203, turning off transistor Q203. As a result, $V_{CC}$ is eventually no longer able to transmit through transistor Q203.

Nevertheless, the same operations that isolate $V_{CC}$ simultaneously function to couple $V_{CCP}$ to output node H. The high signal at node G turns off transistor Q206. The low signal from the primary inverter 40 is inverted by the secondary inverter 42 and the resulting high signal turns on transistor Q207. Subsequently, the high signal from node E turns on transistor Q208. The states of these three transistors cause the coupled drains of transistors Q206 and Q207 to send a low signal to transistor Q209. This turns on Q209 and allow $V_{CCP}$ to charge output node H.

Thus, while the input signal IN is low, the translator prepares to transmit a $V_{CC}$ signal. As IN increases, the ability of $V_{CC}$ to reach output node H increases. As the potential of OUT approaches the $V_{CC}$ level, the translator automatically operates to gradually shut off $V_{CC}$ while coupling $V_{CCP}$ to output node H. The result is a smooth transition of OUT from a low signal of 0 volts to a $V_{CC}$ signal and, finally, to a high signal of magnitude $V_{CCP}$. The smooth transition allowed by this invention can be seen in line I of FIG. 5. The advantage of this embodiment over the first prior art example is particularly evident on the left part of the graph, denoting the output signal OUT in the event of a low to high IN signal. Specifically, line I demonstrates that the speed of this invention is not limited by the presence of a delaying element. Rather, this exemplary embodiment is configured to automatically provide additional charging when the output approaches the desired intermediate voltage. Further, because this embodiment allows for an intermediate boost to $V_{CC}$, there is no need for the inefficiently large charge pump that must be used in the second prior art translator. As a result, this embodiment uses less operating current that does the second prior art translator.

If the signal IN transitions from high to low, then the circuit for this embodiment returns to the state first described: transistor Q202 turns on, grounding the output signal; transistor Q209 turns off, isolating $V_{CCP}$; transistor Q201 turns off, isolating $V_{CC}$ at node F; and transistor Q203 turns on to charge node F to $V_{CC}$ in anticipation of the next low-to-high signal. As shown by the right side of the graph in FIG. 5, although the first prior art translator is not encumbered by the delaying element in the high-to-low transition, this embodiment of the current invention operates faster because it is a smaller circuit.

Finally, one of ordinary skill in the art can appreciate that, although a specific embodiment of this invention has been described above for purposes of illustration, various modifications may be made without departing from the spirit and scope of the invention. As demonstrated in U.S. Pat. No. 5,136,190, by Chern et al., for example, the proper number of inverters would allow the translator to output a $V_{CCP}$ signal in response to a high-to-low input signal change rather than a low-to-high change. As another example, an additional n-channel transistor could be interposed between transistor Q203 and $V_{CC}$. Driving this additional transistor at $V_{CCP}$ would ensure that a signal of magnitude $V_{CC}$ would not be transmitted through transistor Q203 until $V_{CCP}$ exceeded $V_{CC}$. Moreover, a circuit similar to the embodiments disclosed above could be configured to translate an input signal having a low voltage into an output signal having even a lower voltage Accordingly, the invention is not limited except as stated in the claims.

What is claimed is:

1. A method for preparing a circuit for a signal translation through a transitional potential to an ultimate potential, comprising:

isolating a first source having said ultimate potential from an output pathway;

grounding said output pathway;

restricting a second source having said transitional potential to an internal translator node; and configuring said internal translator node to electrically communicate with said output pathway in response to initiating said signal translation.

2. A method for preparing a circuit for a signal translation, comprising:

isolating a first potential source having a first potential, $V_{CCP}$, from an output pathway;

grounding the output pathway;

activating a transistor coupled between a second potential source having a second potential, $V_{CC}$, and an internal translator node to restrict $V_{CC}$ to the internal translator node, wherein $V_{CCP}$ is greater than $V_{CC}$; and configuring the internal translator node to electrically communicate with the output pathway in response to initiating the signal translation, wherein the internal translator node is coupled to provide a feedback to deactivate the transistor during the signal translation to $V_{CCP}$.

3. A method for preparing a circuit for a signal translation from an input signal having an upper potential of $V_{CC}$ to an output signal having an tipper potential of $V_{CCP}$, wherein $V_{CCP}$ is greater than $V_{CC}$, the method comprising:

while the input signal is at ground potential isolating $V_{CCP}$ from an output node;

coupling the output node to the ground potential;

activating a transistor coupled to a $V_{CC}$ supply node and an internal translator node to restrict $V_{CC}$ to the internal translator node; and configuring the internal translator node to electrically communicate with the output node in response to initiating the signal translation, wherein the internal translator node is coupled to provide a feedback to deactivate the transistor during the signal translation to $V_{CCP}$.

* * * * *

UNITED STATES PATENT AND TRADEMARK OFFICE
CERTIFICATE OF CORRECTION

PATENT NO.    : 6,469,542 B2
DATED         : October 22, 2002
INVENTOR(S)   : Troy Manning It is certified that error appears in the above-identified patent and that said Letters Patent is hereby corrected as shown below:

<u>Column 10,</u>
Line 12, replace "an tipper potential" with -- an upper potential --

Signed and Sealed this

Sixth Day of May, 2003

JAMES E. ROGAN
*Director of the United States Patent and Trademark Office*